United States Patent
Park et al.

(10) Patent No.: US 7,652,376 B2
(45) Date of Patent: Jan. 26, 2010

(54) INTEGRATED CIRCUIT PACKAGE SYSTEM INCLUDING STACKED DIE

(75) Inventors: Soo-San Park, Seoul (KR); Hyeog Chan Kwon, Seoul (KR); Sang-Ho Lee, Yeoju (KR); Jong-Woo Ha, Seoul (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/235,521

(22) Filed: Sep. 22, 2008

(65) Prior Publication Data

US 2009/0014899 A1 Jan. 15, 2009

Related U.S. Application Data

(62) Division of application No. 11/306,627, filed on Jan. 4, 2006, now Pat. No. 7,456,088.

(51) Int. Cl.
*H01L 21/44* (2006.01)

(52) U.S. Cl. ............... 257/737; 257/E23.141; 257/777

(58) Field of Classification Search ............... 257/777, 257/686, E23.141, 701, 737
See application file for complete search history.

(56) References Cited

U.S. PATENT DOCUMENTS

| | | | |
|---|---|---|---|
| 4,524,121 A | 6/1985 | Gleim et al. | |
| 4,697,203 A | 9/1987 | Sakai et al. | |
| 4,764,804 A | 8/1988 | Sahara et al. | |
| 4,894,707 A | 1/1990 | Yamawaki et al. | |
| 5,186,383 A | 2/1993 | Melton et al. | |
| 5,214,307 A | 5/1993 | Davis | |
| 5,214,308 A | 5/1993 | Nishiguchi et al. | |
| 5,222,014 A | 6/1993 | Lin | |
| 5,229,960 A | 7/1993 | De Givry | |
| 5,269,453 A | 12/1993 | Melton et al. | |
| 5,323,060 A * | 6/1994 | Fogal et al. | 257/777 |
| 5,340,771 A | 8/1994 | Rostoker | |
| 5,373,189 A | 12/1994 | Massit et al. | |
| 5,436,203 A | 7/1995 | Lin | |
| 5,444,296 A | 8/1995 | Kaul et al. | |
| 5,495,398 A | 2/1996 | Takiar et al. | |
| 5,550,711 A | 8/1996 | Burns et al. | |
| 5,579,207 A | 11/1996 | Hayden et al. | |
| 5,607,227 A | 3/1997 | Yasumoto et al. | |
| 5,650,667 A | 7/1997 | Liou | |
| 5,652,185 A | 7/1997 | Lee | |
| 5,734,199 A | 3/1998 | Kawakita et al. | |
| 5,744,863 A | 4/1998 | Culnane et al. | |
| 5,748,452 A | 5/1998 | Londa | |
| 5,760,478 A | 6/1998 | Bozso et al. | |

(Continued)

FOREIGN PATENT DOCUMENTS

EP 0 430 458 A2 6/1991

(Continued)

*Primary Examiner*—Roy K Potter
(74) *Attorney, Agent, or Firm*—Mikio Ishimaru

(57) ABSTRACT

An integrated circuit package system is provided including providing a wafer with bond pads formed on the wafer. A solder bump is deposited on one or more bond pads. The bond pads and the solder bump are embedded within a mold compound formed on the wafer. A groove is formed in the mold compound to expose a portion of the solder bump. The wafer is singulated into individual die structures at the groove.

9 Claims, 3 Drawing Sheets

U.S. PATENT DOCUMENTS

| | | | |
|---|---|---|---|
| 5,811,351 A | 9/1998 | Kawakita et al. | |
| 5,824,569 A | 10/1998 | Brooks et al. | |
| 5,828,128 A | 10/1998 | Higashiguchi et al. | |
| 5,854,507 A | 12/1998 | Miremadi et al. | |
| 5,898,219 A | 4/1999 | Barrow | |
| 5,899,705 A | 5/1999 | Akram | |
| 5,903,049 A | 5/1999 | Mori | |
| 5,963,430 A | 10/1999 | Londa | |
| 5,977,640 A | 11/1999 | Bertin et al. | |
| 5,977,641 A | 11/1999 | Takahashi et al. | |
| 5,982,633 A | 11/1999 | Jeansonne | |
| 5,994,166 A | 11/1999 | Akram et al. | |
| 6,025,648 A | 2/2000 | Takahashi et al. | |
| RE36,613 E | 3/2000 | Ball | |
| 6,034,875 A | 3/2000 | Heim et al. | |
| 6,075,289 A | 6/2000 | Distefano | |
| 6,083,775 A | 7/2000 | Huang et al. | |
| 6,083,811 A | 7/2000 | Riding et al. | |
| 6,101,100 A | 8/2000 | Londa | |
| 6,107,164 A | 8/2000 | Ohuchi | |
| 6,118,176 A | 9/2000 | Tao et al. | |
| 6,121,682 A | 9/2000 | Kim | |
| 6,130,448 A | 10/2000 | Bauer et al. | |
| 6,143,588 A | 11/2000 | Glenn | |
| 6,144,507 A | 11/2000 | Hashimoto | |
| 6,157,080 A | 12/2000 | Tamaki et al. | |
| 6,165,815 A | 12/2000 | Ball | |
| 6,201,266 B1 | 3/2001 | Ohuchi et al. | |
| 6,201,302 B1 | 3/2001 | Tzu | |
| 6,204,562 B1 | 3/2001 | Ho et al. | |
| 6,225,699 B1 | 5/2001 | Ference et al. | |
| 6,238,949 B1 | 5/2001 | Nguyen et al. | |
| 6,242,932 B1 | 6/2001 | Hembree | |
| 6,246,123 B1 | 6/2001 | Landers, Jr. et al. | |
| 6,265,766 B1 | 7/2001 | Moden | |
| 6,266,197 B1 | 7/2001 | Glenn et al. | |
| 6,274,930 B1 | 8/2001 | Vaiyapuri et al. | |
| 6,291,263 B1 | 9/2001 | Huang | |
| 6,294,406 B1 | 9/2001 | Bertin et al. | |
| 6,297,131 B1 | 10/2001 | Yamada et al. | |
| 6,316,735 B1 | 11/2001 | Higashiguchi | |
| 6,316,838 B1 | 11/2001 | Ozawa et al. | |
| 6,333,552 B1 | 12/2001 | Kakimoto et al. | |
| 6,333,562 B1 * | 12/2001 | Lin | 257/777 |
| 6,340,846 B1 | 1/2002 | LoBianco et al. | |
| 6,353,257 B1 | 3/2002 | Huang | |
| 6,358,773 B1 | 3/2002 | Lin et al. | |
| 6,369,454 B1 | 4/2002 | Chung | |
| 6,372,551 B1 | 4/2002 | Huang | |
| 6,376,904 B1 | 4/2002 | Haba et al. | |
| 6,384,472 B1 | 5/2002 | Huang | |
| 6,388,313 B1 * | 5/2002 | Lee et al. | 257/686 |
| 6,396,116 B1 | 5/2002 | Kelly et al. | |
| 6,400,007 B1 | 6/2002 | Wu et al. | |
| 6,407,381 B1 | 6/2002 | Glenn et al. | |
| 6,407,456 B1 | 6/2002 | Ball | |
| 6,410,861 B1 | 6/2002 | Huang et al. | |
| 6,413,798 B2 | 7/2002 | Asada | |
| 6,414,381 B1 | 7/2002 | Takeda | |
| 6,420,204 B2 | 7/2002 | Glenn | |
| 6,420,244 B2 | 7/2002 | Lee | |
| 6,424,050 B1 | 7/2002 | Komiyama | |
| 6,441,496 B1 | 8/2002 | Chen et al. | |
| 6,445,064 B1 | 9/2002 | Ishii et al. | |
| 6,455,353 B2 | 9/2002 | Lin | |
| 6,462,421 B1 | 10/2002 | Hsu et al. | |
| 6,472,732 B1 | 10/2002 | Terui | |
| 6,489,676 B2 | 12/2002 | Taniguchi et al. | |
| 6,492,726 B1 | 12/2002 | Quek et al. | |
| 6,501,165 B1 | 12/2002 | Farnworth et al. | |
| 6,503,780 B1 | 1/2003 | Glenn et al. | |
| 6,509,639 B1 | 1/2003 | Lin | |
| 6,512,219 B1 | 1/2003 | Webster et al. | |
| 6,512,303 B2 | 1/2003 | Moden | |
| 6,529,027 B1 | 3/2003 | Akram et al. | |
| 6,534,419 B1 | 3/2003 | Ong | |
| 6,538,319 B2 | 3/2003 | Terui | |
| 6,541,857 B2 | 4/2003 | Caletka et al. | |
| 6,545,365 B2 | 4/2003 | Kondo et al. | |
| 6,545,366 B2 | 4/2003 | Michii et al. | |
| 6,552,423 B2 | 4/2003 | Song et al. | |
| 6,555,902 B2 | 4/2003 | Lo et al. | |
| 6,555,917 B1 | 4/2003 | Heo | |
| 6,566,745 B1 | 5/2003 | Beyne et al. | |
| 6,570,249 B1 | 5/2003 | Liao et al. | |
| 6,580,169 B2 | 6/2003 | Sakuyama et al. | |
| 6,583,503 B2 | 6/2003 | Akram et al. | |
| 6,590,281 B2 | 7/2003 | Wu et al. | |
| 6,593,647 B2 | 7/2003 | Ichikawa | |
| 6,593,648 B2 | 7/2003 | Emoto | |
| 6,593,662 B1 | 7/2003 | Pu et al. | |
| 6,599,779 B2 | 7/2003 | Shim et al. | |
| 6,607,937 B1 | 8/2003 | Corisis | |
| 6,610,563 B1 | 8/2003 | Waitl et al. | |
| 6,611,063 B1 | 8/2003 | Ichinose et al. | |
| 6,613,980 B1 | 9/2003 | McGhee et al. | |
| 6,617,198 B2 | 9/2003 | Brooks | |
| 6,621,169 B2 | 9/2003 | Kikuma et al. | |
| 6,621,172 B2 | 9/2003 | Nakayama et al. | |
| 6,627,864 B1 | 9/2003 | Glenn et al. | |
| 6,627,979 B2 | 9/2003 | Park | |
| 6,642,609 B1 | 11/2003 | Minamio et al. | |
| 6,649,445 B1 | 11/2003 | Qi et al. | |
| 6,649,448 B2 | 11/2003 | Tomihara | |
| 6,650,019 B2 | 11/2003 | Glenn et al. | |
| 6,667,556 B2 | 12/2003 | Moden | |
| 6,674,156 B1 | 1/2004 | Bayan et al. | |
| 6,690,089 B2 | 2/2004 | Uchida | |
| 6,692,993 B2 | 2/2004 | Li et al. | |
| 6,693,364 B2 | 2/2004 | Tao et al. | |
| 6,700,178 B2 | 3/2004 | Chen et al. | |
| 6,700,192 B2 | 3/2004 | Matsuzawa et al. | |
| 6,706,557 B2 | 3/2004 | Koopmans | |
| 6,707,140 B1 | 3/2004 | Nguyen et al. | |
| 6,713,366 B2 | 3/2004 | Mong et al. | |
| 6,716,670 B1 | 4/2004 | Chiang | |
| 6,734,539 B2 | 5/2004 | Degani et al. | |
| 6,734,552 B2 | 5/2004 | Combs et al. | |
| 6,734,569 B2 | 5/2004 | Appelt et al. | |
| 6,737,750 B1 | 5/2004 | Hoffman et al. | |
| 6,740,980 B2 | 5/2004 | Hirose | |
| 6,746,894 B2 | 6/2004 | Fee et al. | |
| 6,747,361 B2 | 6/2004 | Ichinose | |
| 6,762,488 B2 | 7/2004 | Maeda et al. | |
| 6,777,799 B2 | 8/2004 | Kikuma et al. | |
| 6,777,819 B2 | 8/2004 | Huang | |
| 6,784,534 B1 | 8/2004 | Glenn et al. | |
| 6,787,915 B2 | 9/2004 | Uchida et al. | |
| 6,787,916 B2 | 9/2004 | Halahan | |
| 6,791,036 B1 | 9/2004 | Chen et al. | |
| 6,791,076 B2 | 9/2004 | Webster | |
| 6,794,741 B1 | 9/2004 | Lin et al. | |
| 6,794,749 B2 | 9/2004 | Akram | |
| 6,809,405 B2 | 10/2004 | Ito et al. | |
| 6,818,980 B1 | 11/2004 | Pedron, Jr. | |
| 6,828,665 B2 | 12/2004 | Pu et al. | |
| 6,833,612 B2 | 12/2004 | Kinsman | |
| 6,835,598 B2 | 12/2004 | Baek et al. | |
| 6,838,761 B2 | 1/2005 | Karnezos | |
| 6,847,105 B2 | 1/2005 | Koopmans | |
| 6,851,598 B2 | 2/2005 | Gebauer et al. | |
| 6,861,288 B2 | 3/2005 | Shim et al. | |
| 6,861,683 B2 | 3/2005 | Rissing et al. | |
| 6,864,566 B2 | 3/2005 | Choi | |

| | | | | | | |
|---|---|---|---|---|---|---|
| 6,881,611 B1 | 4/2005 | Fukasawa et al. | | 7,335,994 B2 | 2/2008 | Klein et al. |
| 6,882,057 B2 | 4/2005 | Hsu | | 2002/0024124 A1 | 2/2002 | Hashimoto |
| 6,890,798 B2 | 5/2005 | McMahon | | 2002/0096755 A1 | 7/2002 | Fukui et al. |
| 6,900,528 B2 | 5/2005 | Mess et al. | | 2002/0100955 A1 | 8/2002 | Potter et al. |
| 6,900,549 B2 | 5/2005 | Brooks | | 2002/0130404 A1 | 9/2002 | Ushijima et al. |
| 6,906,415 B2 | 6/2005 | Jiang et al. | | 2003/0008510 A1 | 1/2003 | Grigg et al. |
| 6,906,416 B2 | 6/2005 | Karnezos | | 2003/0113952 A1 | 6/2003 | Sambasivam et al. |
| 6,930,378 B1 | 8/2005 | St. Amand et al. | | 2003/0153134 A1 | 8/2003 | Kawata et al. |
| 6,930,396 B2 | 8/2005 | Kurita et al. | | 2004/0016939 A1 | 1/2004 | Akiba et al. |
| 6,933,598 B2 | 8/2005 | Karnezos | | 2004/0061213 A1 | 4/2004 | Karnezos |
| 6,951,982 B2 | 10/2005 | Chye et al. | | 2004/0119153 A1 | 6/2004 | Karnezos |
| 6,972,481 B2 | 12/2005 | Karnezos | | 2004/0124540 A1 | 7/2004 | Chen et al. |
| 7,030,489 B2 * | 4/2006 | Kang et al. ............... 257/723 | | 2004/0166605 A1 | 8/2004 | Kuratomi et al. |
| 7,034,387 B2 | 4/2006 | Karnezos | | 2004/0201087 A1 | 10/2004 | Lee |
| 7,034,388 B2 | 4/2006 | Yang et al. | | 2004/0212096 A1 | 10/2004 | Wang |
| 7,045,887 B2 | 5/2006 | Karnezos | | 2005/0051882 A1 | 3/2005 | Kwon et al. |
| 7,049,691 B2 | 5/2006 | Karnezos | | 2005/0075053 A1 | 4/2005 | Jung |
| 7,053,476 B2 | 5/2006 | Karnezos | | 2006/0043556 A1 | 3/2006 | Su et al. |
| 7,053,477 B2 | 5/2006 | Karnezos et al. | | 2006/0065958 A1 | 3/2006 | Tsao et al. |
| 7,057,269 B2 | 6/2006 | Karnezos | | 2006/0138631 A1 | 6/2006 | Tao et al. |
| 7,061,088 B2 | 6/2006 | Karnezos | | 2006/0189033 A1 | 8/2006 | Kim |
| 7,064,426 B2 | 6/2006 | Karnezos | | 2006/0197209 A1 | 9/2006 | Choi et al. |
| 7,071,568 B1 | 7/2006 | St. Amand et al. | | 2006/0244157 A1 | 11/2006 | Carson |
| 7,081,678 B2 | 7/2006 | Liu | | | | |
| 7,084,500 B2 | 8/2006 | Swnson et al. | | FOREIGN PATENT DOCUMENTS | | |
| 7,090,482 B2 | 8/2006 | Tsukahara et al. | | | | |
| 7,093,358 B2 | 8/2006 | Akram et al. | | EP 0 652 630 A2 | | 5/1995 |
| 7,101,731 B2 | 9/2006 | Karnezos | | JP 05152505 A | | 6/1993 |
| 7,109,574 B2 | 9/2006 | Chiu et al. | | JP 2001223326 A | | 8/2001 |
| 7,115,990 B2 | 10/2006 | Kinsman | | KR 2001068614 A | | 7/2001 |
| 7,119,427 B2 | 10/2006 | Kim | | KR 2004085348 A | | 10/2004 |
| 7,122,906 B2 | 10/2006 | Doan | | WO 98/50954 A1 | | 11/1998 |
| 7,176,506 B2 | 2/2007 | Beroz et al. | | WO 02/084716 A2 | | 10/2002 |
| 7,218,005 B2 | 5/2007 | Tago | | WO 03/032370 A2 | | 4/2003 |
| 7,221,059 B2 | 5/2007 | Farnworth et al. | | | | |
| 7,298,045 B2 | 11/2007 | Fujitani et al. | | * cited by examiner | | |

INTEGRATED CIRCUIT PACKAGE SYSTEM INCLUDING STACKED DIE

CROSS-REFERENCE TO RELATED APPLICATION(S)

This application is a Divisional of co-pending U.S. application Ser. No. 11/306,627 filed Jan. 4, 2006, and the subject matter thereof is hereby incorporated herein by reference thereto.

The present application contains subject matter related to co-pending U.S. application Ser. No. 11/326,211 filed Jan. 4, 2006. The related application is assigned to STATS ChipPAC Ltd. and the subject matter thereof is incorporated herein by reference thereto.

The present application contains subject matter also related to co-pending U.S. application Ser. No. 11/326,206 filed Jan. 4, 2006. The related application is assigned to STATS ChipPAC Ltd. and the subject matter thereof is incorporated herein by reference thereto.

The present application contains subject matter also related to U.S. application Ser. No. 11/306,628 filed Jan. 4, 2006, now U.S. Pat. No. 7,364,945. The related application is assigned to STATS ChipPAC Ltd. and the subject matter thereof is incorporated herein by reference thereto.

TECHNICAL FIELD

The present invention relates generally to integrated circuit package systems, and more particularly to an integrated circuit package system including stacked die.

BACKGROUND ART

In the electronics industry, as products such as cell phones and camcorders become smaller and smaller, increased miniaturization of integrated circuit (IC) packages has become more and more critical. At the same time, higher performance and lower cost have become essential for new products.

Usually, many individual integrated circuit devices are constructed on the same wafer and groups of integrated circuit devices are separated into individual integrated circuit die.

One approach to putting more integrated circuit dies in a single package involves stacking the dies with space between the dies for wire bonding. The space is achieved by means of a thick layer of organic adhesive or in combination with inorganic spacers of material such as silicon (Si), ceramic, or metal. Unfortunately, the stacking adversely affects the performance of the package because of decreased thermal performance due to the inability to remove heat through the organic adhesive and/or inorganic spacers. As the number of dies in the stack increases, thermal resistance increases at a faster rate. Further, such stacked dies have a high manufacturing cost.

Generally, semiconductor packages are classified into a variety of types in accordance with their structures. In particular, semiconductor packages are classified into an in-line type and a surface mount type in accordance with their mounting structures. Examples of in-line type semiconductor packages include a dual in-line package (DIP) and a pin grid array (PGA) package. Examples of surface mount type semiconductor packages include quad flat package (QFP) and a ball grid array (BGA) package.

Recently, the use of surface mount type semiconductor packages has increased, as compared to in-line type semiconductor packages, in order to obtain an increased element mounting density of a printed circuit board. A conventional semiconductor package has a size considerably larger than that of the semiconductor chip used. For this reason, this semiconductor package cannot meet the recent demand for a light, thin, simple, miniature structure. As a result, it is hard for the conventional semiconductor package to meet the demand for a highly integrated miniature structure.

Furthermore, the fabrication method used to fabricate the conventional semiconductor package involves a relatively large number of processes. For this reason, a need therefore exists for reducing the costs through use of simplified processes. In view of the ever-increasing need to save costs and improve efficiencies, it is more and more critical that answers be found to these problems.

DISCLOSURE OF THE INVENTION

The present invention provides an integrated circuit package system including providing a wafer with bond pads formed on the wafer. A solder bump is deposited on one or more bond pads. The bond pads and the solder bump are embedded within a mold compound formed on the wafer. A groove is formed in the mold compound to expose a portion of the solder bump. The wafer is singulated into individual die structures at the groove.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
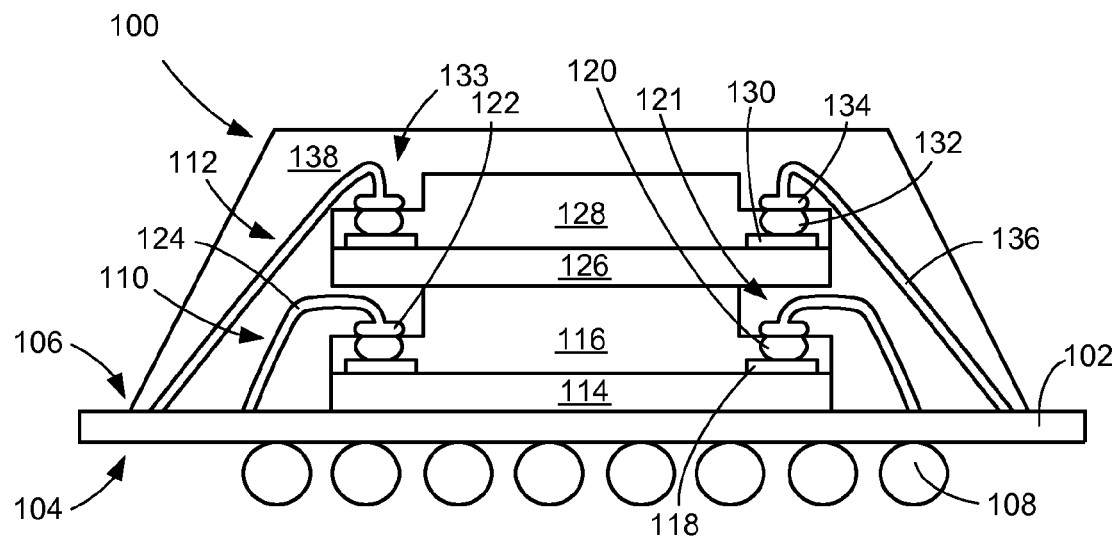
FIG. 1 is a cross-sectional view of an integrated circuit package system in accordance with an embodiment of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the device are semi-diagrammatic and not to scale and, particularly, some of the dimensions are for the clarity of presentation and are shown greatly exaggerated in the drawing FIGs. Generally, the device can be operated in any orientation. The same numbers are used in all the drawing FIGs. to relate to the same elements.

The term "horizontal" as used herein is defined as a plane parallel to the conventional plane or surface of the wafer, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit package system 100 in accordance with an embodiment of the present invention. A printed circuit board 102 (PCB) has a first surface 104 and a second surface 106 opposite to the first surface 104. Solder balls 108 are disposed against the first surface 104. A first semiconductor structure 110 is coupled to the second surface 106 of the printed circuit board 102. A second semiconductor structure 112 is stacked on top of the first semiconductor structure 110.

The first semiconductor structure 110 includes a die 114 having a mold compound 116. The die 114 has bond pads 118 electrically connected to the integrated circuits (not shown) within the die 114. The mold compound 116 includes solder bumps 120 bonded to the bond pads 118, and a recess 121 formed into the edges of the mold compound 116.

The recess 121 partially expose the solder bumps 120. Electrical connectors, including wire bonds 122 and bond wires 124, couple the solder bumps 120 to the printed circuit board 102. The height of the recess 121 is tall enough to provide a clearance for the electrical connectors disposed underneath the second semiconductor structure 112. The wire bonds and a portion of the bond wires are located within the recess 121. The combined height of the mold compound 116 and the die 114 is greater than the height of the electrical connectors.

The second semiconductor structure 112 includes a die 126 having a mold compound 128. A bottom surface of the die 126 is coupled to a top surface of the mold compound 116 of the first semiconductor structure 110. The die 126 has bond pads 130 electrically connected to the integrated circuits (not shown) within the die 126. The mold compound 128 includes solder bumps 132 bonded to the bond pads 130, and a recess 133 formed into the edges of the mold compound 128. The recess 133 partially exposes the solder bumps 132. Electrical connectors, including wire bonds 134 and bond wires 136, couple the solder bumps 132 to the printed circuit board 102.

The recesses 121 and 133 can be on two sides of the first and second semiconductor structures 110 and 112 or on all four sides for quad-packages. The first and second semiconductor structures 110 and 112 can be subsequently encapsulated in an encapsulant 138 to protect the bond wires 124 and 136 and to form the integrated circuit package system 100 with a low profile.

Figure 2:
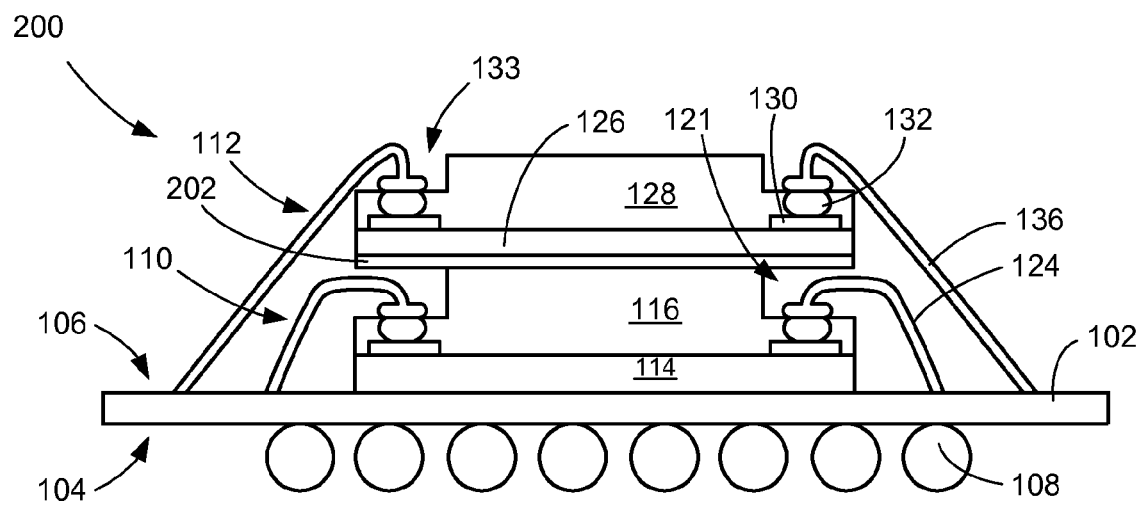
FIG. 2 is a cross-sectional view of an integrated circuit package system in accordance with another embodiment of the present invention.

Referring now to FIG. 2, therein is shown a cross-sectional view of an integrated circuit package system 200 in accordance with another embodiment of the present invention. The integrated circuit package system 200 includes a similar structure to the integrated circuit package system 100. In addition, a layer of film laminate 202 is applied between the top surface of the mold compound 116 of the first semiconductor structure 110 and the bottom surface of the die 126 of the second semiconductor structure 112. The layer of film laminate 202 provides insulation between the first and second semiconductor structures 110 and 112, and may act as an adhesive material.

The recesses 121 and 133 can be on two sides of the first and second semiconductor structures 110 and 112 or on all four sides for quad-packages. The first and second semiconductor structures 110 and 112 can be subsequently encapsulated to protect the bond wires 124 and 136 and to form the integrated circuit package system 200 with a low profile.

Figure 3A:
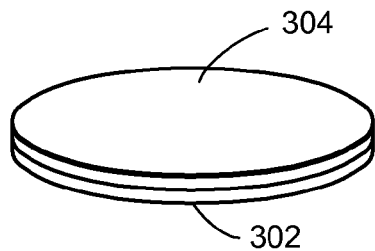
FIG. 3A is a perspective view of a wafer in a bumped step in accordance with an embodiment of the present invention.

Referring now to FIG. 3A, therein is shown a perspective view of a wafer 302 in a bumped and mold step in accordance with an embodiment of the present invention. A mold compound 304 is applied on the wafer 302. The mold compound 304 may be spun-on, poured within a rim barrier, injected in a mold, or otherwise applied.

Figure 3B:
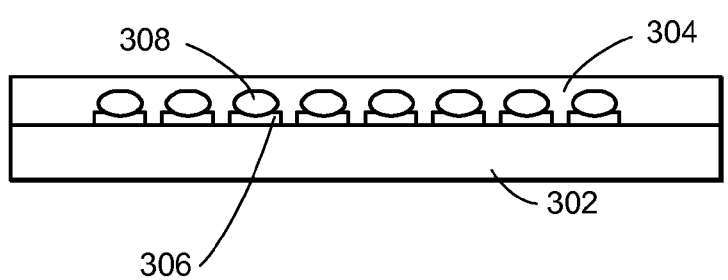
FIG. 3B is a cross-sectional view of a wafer in a bumped step as in FIG. 3A.

Referring now to FIG. 3B, therein is shown a cross-sectional view of the wafer 302 in a bumped and mold step as in FIG. 3A. Bond pads 306 are formed on the wafer 302 in connection with the integrated circuits (not shown) in the wafer 302. Solder bumps 308 are then deposited on the bond pads 306 followed by the deposition of the mold compound 304.

Figure 4:
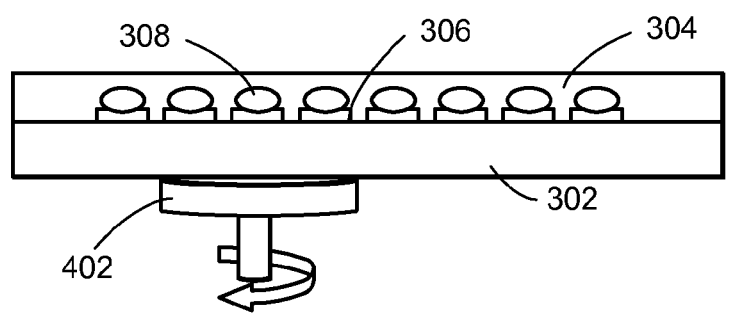
FIG. 4 is the structure of FIG. 3B in a grinding step in accordance with an embodiment of the present invention.

Referring now to FIG. 4, therein is shown the structure of FIG. 3B in a grinding step in accordance with an embodiment of the present invention. The bottom, exposed surface of the wafer 302 is planarized to a specified surface flatness and thickness. In accordance with one embodiment, the surface is planarized by grinding using a grinding wheel 402.

The planarization permits the dies 124 and 126 to be extremely thin but partially supported for strength by the mold compounds 116 and 128 so they may be safely handled. This extreme thinness also helps reduce the package profile. Furthermore, the planarization allows for better accuracy for the following sawing step.

Figure 5:
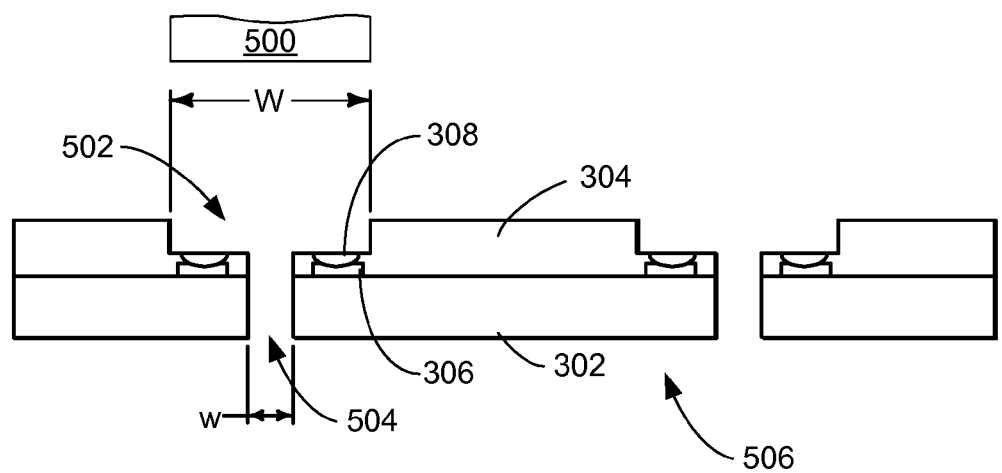
FIG. 5 is the structure of FIG. 4 in a sawing step in accordance with an embodiment of the present invention.

Referring now to FIG. 5, therein is shown the structure of FIG. 4 in a sawing step in accordance with an embodiment of the present invention. A portion of the wafer 302 and the mold compound 304 are cut. For example, a thick blade 500 may be used for creating a groove 502 of width "W" on a portion of the surface of the mold compound 304 such that it exposes a portion of the solder bumps 308. A dicing saw may be used for cutting the wafer 302 and the mold compound 304 to create a cut 504 of width "w" between each die structure to yield an integrated circuit package 506.

The groove 502 reduces the thickness of the mold compound 304, which must be sawn, while the mold compound 304 helps prevent defects during the dicing operation.

Figure 6:
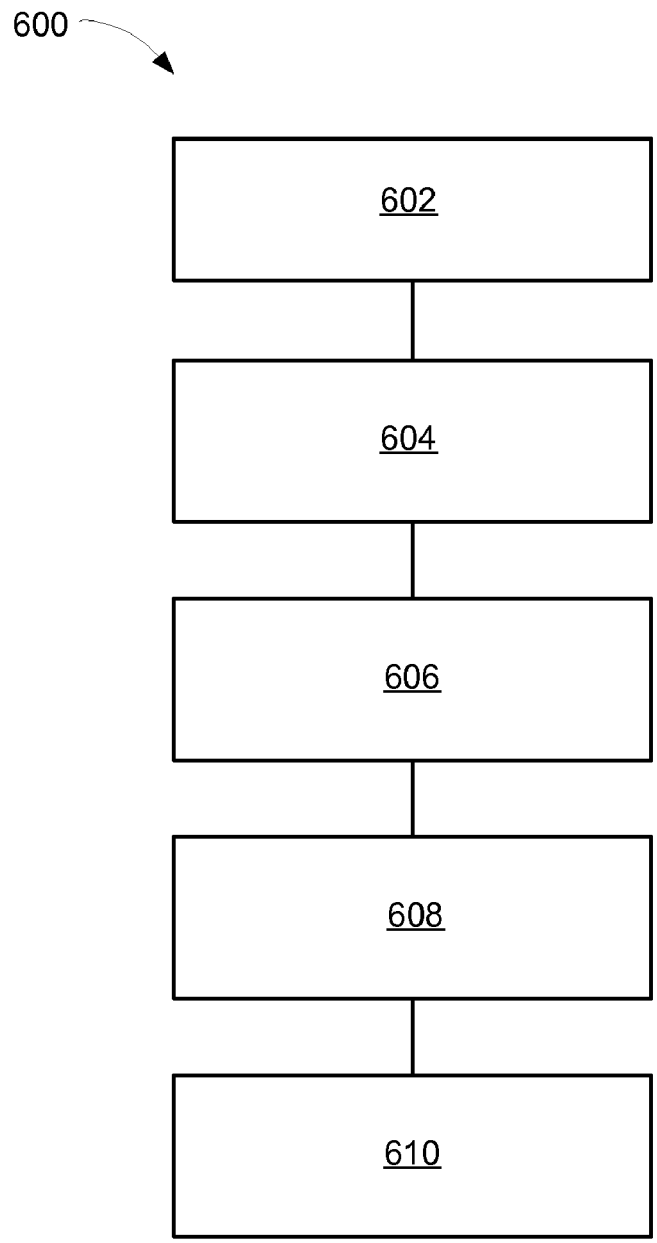
FIG. 6 is a flow chart of an integrated circuit package system in accordance with an embodiment of the present invention.

Referring now to FIG. 6, therein is shown a flow chart of an integrated circuit package system 600 for manufacturing the system 100 in accordance with an embodiment of the present invention. The system 600 includes providing a wafer with bond pads formed on the wafer in a block 602; depositing solder bumps on one or more bond pads in a block 604; embedding the bond pads and the solder bumps within a mold compound on the wafer in a block 606; forming a groove in the mold compound to expose a portion of the solder bumps in a block 608; and singulating the wafer at the groove into individual die structures in a block 610.

In greater detail, an integrated circuit package system including stacked die, according to an embodiment of the present invention, is performed as follows:

1. providing the wafer 302. (FIG. 3A)
2. applying the layer of mold compound 304 on the wafer 302. (FIG. 3B)
3. forming bond pads 306 on the wafer 302 in connection with the integrated circuits in the wafer 302. (FIG. 3B)
4. depositing solder bumps 308 on the bond pads 306 (FIG. 3B)
5. depositing the mold compound 304. (FIG. 3B)

6. planarizing the bottom, exposed surface of the wafer 302 to a specified surface flatness and thickness. (FIG. 4)
7. forming the groove 502 of width "W" on a portion of the surface of the layer of mold compound 304 such that it exposes a portion of the solder bump 308. (FIG. 5)
8. cutting through the wafer 302 and the remaining layer of the mold compound 304 to create the cut 504 of width "w" between each die structure to yield the integrated circuit package 506. (FIG. 5)

It has been discovered that the present invention thus has numerous aspects.

An aspect of the present invention is that it valuably supports and services the historical trend of reducing costs, simplifying systems, and increasing performance.

These and other valuable aspects of the present invention consequently further the state of the technology to at least the next level.

The resulting processes and configurations are straightforward, cost-effective, uncomplicated, highly versatile and effective, can be implemented by adapting known technologies, and are thus readily suited for efficiently and economically manufacturing large die IC packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The invention claimed is:

1. An integrated circuit package system comprising:
 a die with bond pads formed on the die and a planarized bottom exposed surface;
 a solder bump deposited on one or more bond pads;
 a mold compound formed on the die, the mold compound embedding the bond pads and the solder bump; and
 a recess formed into the edges of the mold compound to expose a portion of the solder bump.

2. The system as claimed in claim 1 wherein the exposed portion of the solder bump further comprises:
 a top portion of the solder bump.

3. The system as claimed in claim 1 wherein the recess is above the bond pads.

4. The system as claimed in claim 1 further comprising:
 a wire bond attached to the exposed portion of the solder bump in the recess.

5. An integrated circuit package system comprising:
 a die with bond pads formed on the die;
 a solder bump deposited on one or more bond pads;
 a mold compound formed on the die, the mold compound embedding the bond pads and the solder bump;
 a recess formed into the edges of the mold compound to expose a portion of the solder bump;
 a printed circuit board connected to a bottom exposed surface of the die; and
 electrical connectors connected to the exposed portion of the solder bump and the printed circuit board, wherein a combined height of the mold compound and the die is at least greater than a height of the electrical connectors.

6. The system as claimed in claim 5 wherein the electrical connectors further comprises:
 wire bonds attached to the exposed portion of the solder bump; and
 bond wires electrically coupled to the wire bonds and the printed circuit board.

7. The system as claimed in claim 5 further comprising:
 a semiconductor structure mounted on the mold compound.

8. The system as claimed in claim 7 further comprising:
 a layer of laminate film deposited between the semiconductor structure and the mold compound.

9. The system as claimed in claim 5 further comprising:
 an encapsulant encapsulating the electrical connectors, the die, and the mold compound.

* * * * *